(12) United States Patent
Chung

(10) Patent No.: US 6,581,276 B2
(45) Date of Patent: Jun. 24, 2003

(54) FINE-PITCH FLEXIBLE CONNECTOR, AND METHOD FOR MAKING SAME

(75) Inventor: Kevin Kwong-Tai Chung, Princeton, NJ (US)

(73) Assignee: Amerasia International Technology, Inc., Princeton Junction, NJ (US)

( * ) Notice: Subject to any disclaimer, the term of this patent is extended or adjusted under 35 U.S.C. 154(b) by 130 days.

(21) Appl. No.: 09/797,034

(22) Filed: Mar. 1, 2001

(65) Prior Publication Data

US 2001/0029119 A1 Oct. 11, 2001

Related U.S. Application Data (60) Provisional application No. 60/194,434, filed on Apr. 4, 2000, provisional application No. 60/229,882, filed on Sep. 1, 2000, and provisional application No. 60/250,923, filed on Dec. 1, 2000.

(51) Int. Cl.[7] .............................................. H01R 43/00
(52) U.S. Cl. .......................................... 29/825; 29/874
(58) Field of Search ........................... 29/830, 846, 825, 29/874, 878

(56) References Cited

U.S. PATENT DOCUMENTS

| | | |
|---|---|---|
| 3,998,513 A * | 12/1976 | Kobayashi et al. ......... 156/250 |
| 4,408,814 A | 10/1983 | Takashi et al. |
| 4,820,170 A * | 4/1989 | Redmond et al. ........... 439/260 |
| 4,954,873 A * | 9/1990 | Lee et al. .................... 257/702 |
| 5,051,366 A | 9/1991 | Anderson et al. |
| 5,123,851 A | 6/1992 | Young et al. |
| 5,314,342 A | 5/1994 | Figge |
| 5,373,109 A | 12/1994 | Argyrakis et al. |
| 5,380,212 A | 1/1995 | Smeenge, Jr. et al. |
| 5,554,042 A | 9/1996 | Denninger |
| 5,667,884 A | 9/1997 | Bolger |
| 5,904,580 A | 5/1999 | Kozel et al. |

OTHER PUBLICATIONS

Z–Axis Connector Company—Elastomeric Connectors for Miniature Electronic Packaging, Home, http://www.z–axis-cc.com/, 1999, 2 Pages.
Z–Axis Connector Company,LCD Connectors, http://www.z–axiscc.com/prodlcd.htm, 1999, 2 Pages.
Z–Axis Connector Company, Silver STAX, http://www.z–axiscc.com/prodstax.htm, 1999, 3 Pages.
Z–Axis Connector Company, Matrix Moe, http://www.z–axiscc.com/prodmoe.htm, 1999, 3 Pages.
Fujipoly America Corp—Zebra Elastomeric Connectors, http://www.fujipoly.com/products/genProductLine.asp?ProductLine=Zebra, 2000, 4 Pages.

* cited by examiner

Primary Examiner—Edward K. Look
Assistant Examiner—Dwayne J. White
(74) Attorney, Agent, or Firm—Dann, Dorfman, Herrell & Skillman, P.C.

(57) ABSTRACT

A fine-pitch flexible electrical connector includes a plurality of generally parallel metal conductors in a matrix of a molecularly flexible dielectric adhesive, and may be made in various sizes and thicknesses so as to be utilized as a connector, jumper, test membrane, interposer or other electrical connection structure providing connection between two or more electronic devices and/or substrates. The connector is made by providing a number of metal conductors disposed in relation to the dielectric adhesive, such as by lamination or aggregation, and then separating individual connectors therefrom by cutting, slicing and/or otherwise separating transversely to the longitudinal direction of the conductors.

62 Claims, 7 Drawing Sheets

FINE-PITCH FLEXIBLE CONNECTOR, AND METHOD FOR MAKING SAME

This Application claims the benefit of U.S. Provisional Application Ser. No. 60/194,434 filed Apr. 4, 2000, of U.S. Provisional Application Ser. No. 60/229,882 filed Sep. 1, 2000, of U.S. Provisional Application Ser. No. 60/250,923 filed Dec. 1, 2000, and of U.S. patent application Ser. No. 09/727,307 filed Nov. 30, 2000.

The present invention relates to electrical connectors and, in particular, to a method for making an electrical connector employing flexible adhesive.

Silicone rubber compression connectors made with alternating layers of conductor and insulator material have been in use for making temporary and/or permanent electrical connections between two electrical circuit boards, such as conventional printed wiring circuit boards, for at least thirty years. Compression connectors and/or compression jumpers are so called because they are clamped to or otherwise compressed or held under pressure between the two electrical circuit boards for making electrical connection therebetween. These connectors have the desirable characteristic of being compliant and compressible due to the characteristics of the silicone rubber, and so can accommodate variations in flatness and tolerances of the contact pads on each of the circuit boards to which they make electrical connection.

Typical conventional compressible connectors are made using a silicone rubber dielectric matrix having conductors therein provided by compatible silicone rubber that is filled with carbon, silver, gold or other conductive material. The use of silicone rubber for both dielectric and conductors provides for proper bonding therebetween for mechanical strength. A thickness along the direction of electrical conduction of about 1 mm (about 40 mils) is typical, and such silicone rubber connectors are available from several suppliers, such a ZEBRA® elastomeric connectors from Fujipoly (Internet URL www.fujipoly.com) and Z-axis Connector Company (Internet URL www.z-axiscc.com).

Although the silicone rubber elastomeric connectors may be "ideal" for some applications, the silicone rubber presents certain drawbacks and disadvantages. For example, uncured silicone rubber, e.g., silicone molecules, may leach out or otherwise come to be disposed upon electrical contacts and contact pads, thereby to caus problems in soldering, bonding or otherwise making reliable electrical connection thereto. A further disadvantage is that mechanical fasteners and/or clamps are necessary to make electrical connection to such silicone rubber connectors, which increases the cost of the use thereof both with respect to the cost of the connector and of the labor necessary to utilize it, but allows replacement and rework.

Conventional elastomeric compression connectors have been made by many techniques that can provide a suitably fine pitch (i.e. the center-to-center spacing of adjacent conductors) for conventional printed circuit board applications. At fine pitch, e.g., pitch as fine as about 2–10 mils (about 50–250 µm), manufacturability becomes limited by the available electrically conductive filler materials that fill the silicone elastomer to render it electrically conductive. In fact, very few such elastomeric compression connectors are suitable for pitches less than about 6 mils (about 150 µm), either because their current-carrying capacity is too small or because they are too difficult to manufacture.

Accordingly, there is a need for an electrical connector suitable for manufacture at fine conductor pitch while providing improved current-carrying capacity as compared to conventional elastomeric compression connectors.

To this end, the method of the present invention comprises providing a plurality of elongated metal conductors of an electrically-conductive metal;

placing the plurality of elongated metal conductors in generally parallel spaced-apart spatial relationship;

filling the spaces between the spaced apart elongated metal conductors with a molecularly flexible dielectric adhesive;

drying or B-staging the molecularly flexible dielectric adhesive;

whereby the plurality of elongated metal conductors are embedded in the dried or B-staged molecularly flexible dielectric adhesive; and cutting the dried or B-staged molecularly flexible dielectric adhesive and the elongated metal conductors embedded therein in a direction transverse to the elongated direction of the elongated metal conductors.

BRIEF DESCRIPTION OF THE DRAWING

The detailed description of the preferred embodiments of the present invention will be more easily and better understood when read in conjunction with the FIGURES of the Drawing which include.

In the Drawing, where an element or feature is shown in more than one drawing figure, the same alphanumeric designation may be used to designate such element or feature in each figure, and where a closely related or modified element is shown in a figure, the same alphanumerical designation primed may be used to designate the modified element or feature. Similarly, similar elements or features may be designated by like alphanumeric designations in different figures of the Drawing and with similar nomenclature in the specification, but in the Drawing are preceded by digits unique to the embodiment described. For example, a particular element may be designated as "xx" in one figure, by "1xx" in another figure, by "2xx" in another figure, and so on. It is noted that, according to common practice, the various features of the drawing are not to scale, and the dimensions of the various features are arbitrarily expanded or reduced for clarity.

DESCRIPTION OF THE PREFERRED EMBODIMENTS

Figures 1A, 1B:
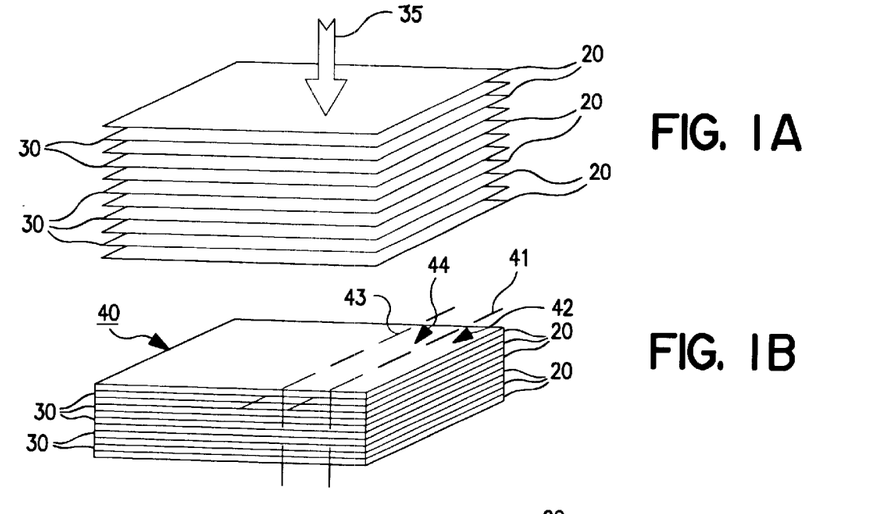
FIGS. 1A through 1E are schematic diagrams relating to a sequence of exemplary steps for making an exemplary electrical connector, in accordance with the invention.

FIGS. 1A through 1E are schematic diagrams of a sequence of exemplary steps for making an exemplary electrical connector 10, in accordance with the invention. FIG. 1A illustrates a plurality of sheets 20 of molecularly flexible adhesive, which may be, for example, a B-staged or dried thermoplastic or thermosetting adhesive, that are alternatingly interleaved with a plurality of sheets 30 of electrically conductive material, preferably a metal, such as layers 30 of metal foil or thin metal sheets. The stack of alternating insulating and conductive sheets 20, 30, is then laminated together (indicated by arrow 35) under suitable pressure and heat to cause the adhesive layers thereof to melt flow and adhere to adjacent layers to form a unitary stack 40 having alternating layers of conductive and insulating (dielectric) material, as illustrated in FIG. 1B. The stack should not be heated to a sufficiently high temperature to cause the adhesive to cure if it is a thermosetting adhesive.

Dielectric or insulating sheets 20 may be, for example, a B-staged or dried thermoplastic or thermosetting dielectric adhesive or a combination thereof. Suitable insulating adhesives include molecularly flexible electrically-insulating adhesives, such as flexible dielectric adhesive films, or flexible polymers that filled with particles that may or may not be highly thermally conductive. Suitable dielectric adhesives include type ESP7455 and ESP7558 thermosetting flexible adhesive or type CC7450, CB7130 and TP7150 thermoplastic flexible adhesive, which are available from AI Technology, Inc. The preferred dielectric adhesives have a dielectric strength of 300–3000 volts per mil (about 12–120 volts/$\mu$m), or higher, and have a dielectric constant in the range of about 2–6 and a dielectric loss less than about 0.1. Where it is desired that substantial capacitance be exhibited between adjacent conductors, dielectric adhesives having a controlled higher dielectric constant, e.g., in the range of 6–60 measured at 1 MHZ, may be employed. Dielectric adhesives may be filled with dielectric particles to control their dielectric constant, e.g., up to 30 or higher for a capacitive application, and/or with thermally conductive particles such as alumina, aluminum nitride, boron nitride, zinc oxide, diamond and the like.

Suitable metals include any suitable electrical conductor, such as copper, aluminum, brass, bronze, nickel, tin, indium, lead, zinc, silver, gold, and combinations and alloys thereof.

Alternatively, however, sheets 30 may be molecularly flexible electrically-conductive adhesives, such as flexible conductive adhesive films, carbon composite, or flexible polymers filled with electrically-conductive particles. Suitable electrically-conductive adhesives include type ESP8450 thermosetting electrically-conductive flexible adhesive or type TP8150 thermoplastic electrically-conductive flexible adhesive, both of which are available from AI Technology, Inc., located in Princeton Junction, N.J. Adhesives that are a blend of thermosetting and thermoplastic adhesives may also be utilized.

An adhesive is "molecularly flexible" if it has a modulus of elasticity (MOE) of about 500,000 psi (about 35,000 kg/cm$^2$) or less, and a glass transition temperature $T_g$ that is below about 25° C. Such adhesives withstand at least 30% elongation without tearing or other failure of the adhesive, and may include a thermoplastic adhesive, a thermosetting adhesive or a blend of thermoplastic and thermosetting adhesives. While materials that have a higher modulus of elasticity may flex if they are made thin enough, they are not molecularly flexible. Molecularly flexible adhesive as used herein specifically excludes silicone and silicone-based elastomers.

While molecularly flexible adhesives as defined above are suitable and adequate and preferred, adhesives having a MOE of about 100,000 psi (about 7000 kg/cm$^2$) or less and a $T_g$ of –25° C. or lower, such as dielectric types ESP7455, CB7130 and TP7170, and electrically-conductive adhesives such as types ESP8450 and TP7150, are more preferable. The preferred flexible adhesives typically withstand 100% elongation without tearing or other failure of the adhesive. While silicone elastomers could be utilized, at least for the dielectric adhesive layers, they are preferably avoided because of the possibility of migration of non-curing silicone molecules that may cause bonding and/or soldering problems and/or render electrical connections less reliable.

Figure 1C:
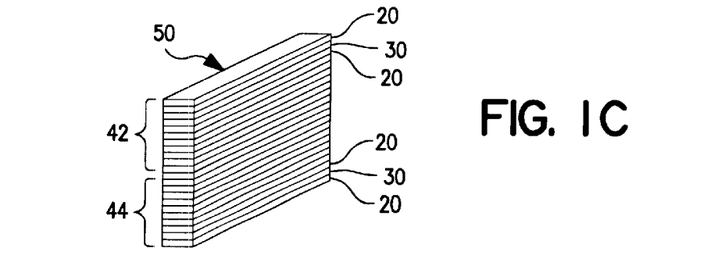

Laminated stack 40 is then sliced or cut in a plane perpendicular to the planes of dielectric and conductive layers 20 and 30, respectively, to separate a plurality of stack slices 42, 44 having the same number of conductive layers as does laminated stack 40. In other words, if layers 20, 30 are considered to lie in the X-Y plane, then cuts 41 and 43 (represented by dashed lines) are made in the X-Z plane or in the Y-Z plane to separate stack slices 42 and 44 and so forth from laminated stack 40. Stack slices 42, 44 are then stacked one on top of another and laminated together as above to form a greater stack 50 as illustrated in FIG. 1C. Greater stack 50 has a number of conductive layers 30 provided by the aggregate number of conductors 30 of stacks 42, 44. While only two cuts 41, 43 are illustrated to separate two stack slices 42, 44, many more cuts are made to separate many more slices which are then combined to form many more greater stacks 50 of slices 42, 44.

Figure 1D:
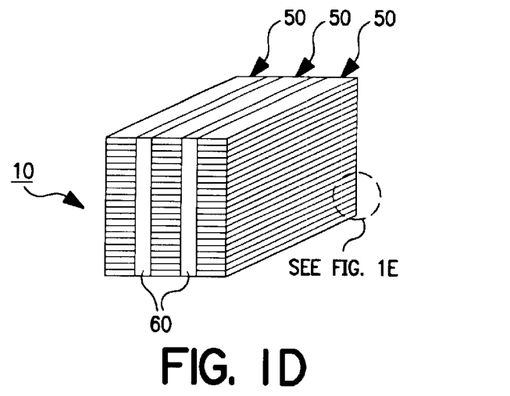
Figure 1E:
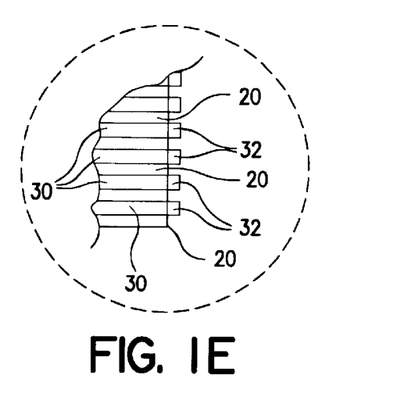

Next, a plurality of stacks of greater stacks 50 are alternatingly interleaved side-by-side with sheets or layers 60 of dielectric adhesive and are laminated together under heat and pressure as above to form a unitary connector or jumper 10 having a plurality of electrical conductors therethrough, as illustrated in FIG. 1D. As illustrated in the expanded schematic diagram of FIG. 1E, conductors 30 are interleaved with and separated by layers of dielectric 20. Where conductors 30 are of a metal that can oxidize or otherwise react to interfere with the later making of a reliable electrical connection, such as copper or aluminum, a layer 32 of an oxidation resistant metal, such as a noble metal or a precious metal, is provided, e.g., by plating or other suitable deposition method, on the exposed ends of conductors 30. A nickel-gold layer 32 (i.e. a nickel layer on copper 30 and gold layer on the nickel layer, is preferred for copper conductors 30. Other suitable metals include tin, solder, silver, gold, palladium, platinum and the like, and combinations and alloys thereof.

For simplicity of a representative illustration, the making of a connector 10 having three greater stacks 50 each having two stacks of slices 42, 44 is described. It is noted that each greater stack 50 may include more than two stack slices 42, 44 and so forth to any desired number that can be conveniently handled to increase the height of connector 10 and the number of conductors 30 in the height direction, and likewise, any convenient number of greater stacks 50 may be placed side-by-side as desired to increase the width of connector 10 and the number of conductors 30 in the width direction.

While the dimensions such as the thickness of each layer and the number of layers will vary in correspondence to the intended application of a connector 10, each metal conductor layer 30 is typically about 2.5–250 $\mu$m (about 0.1–10 mils) thick, and each dielectric adhesive layer 20 is typically of similar thickness. The dielectric adhesive is preferably filled with non-electrically-conductive particles having a diameter up to about one-half the desired thickness of layer 20 so as to provide a positive mechanical separation between metal layers 30 for obtaining the desired dielectric strength and avoiding electrical shorts. Suitable fillers include particles of alumina, aluminum nitride, boron nitride, zinc oxide, diamond and the like, as well as glass spheres, glass balloons and hollow spheres, and the like.

The connector 10 according to the invention is an electrical connection structure capable of improved performance as compared to typical conventional rubber compression connectors. Connectors 10 may be utilized as connectors, jumpers, interposers for flip-chip and ball-grid devices, as anisotropic or Z-axis conductive sheets, and for wafer-level and chip-scale testing and/or burn-in of integrated circuit devices, and are flexible as a result of the flexibility of the dielectric adhesives utilized. Because conductors 30 are of solid metal, they have a much higher current-carrying capacity and a lower resistance than do comparatively sized conventional conductive elastomer conductors. In addition, conductors 30 may be directly bonded to other electrical conductors, such as by solder connection or electrically-conductive adhesive, without the use of additional mechanical fasteners or clamps. The method for making connector 10 makes possible finer conductor pitch than conventional rubber compression connectors while providing high dielectric insulation, and is even a greater improvement over the pitch attainable by conventional spring-compressible pin connectors that are typically used for temporarily connecting electrical devices for testing. Dielectric isolation is further improved where intermediate layers of polyimide or other polymer sheet are included.

Figure 2A:
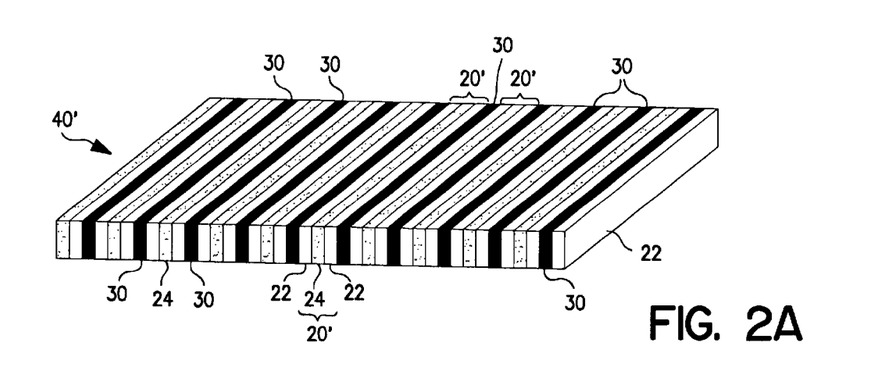
FIGS. 2A and 2B are schematic diagrams relating to a sequence of exemplary steps for making an alternative exemplary electrical connector, in accordance with the invention.
Figure 2B:
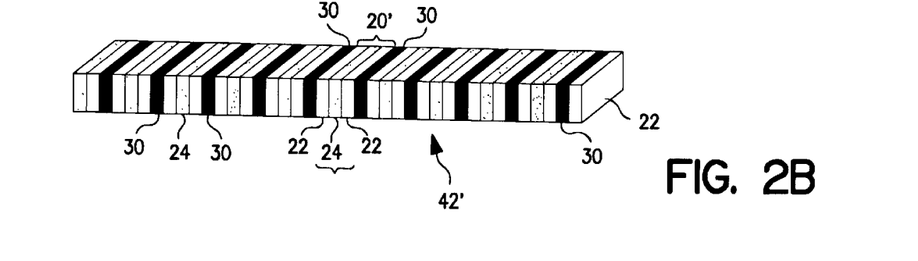

FIGS. 2A and 2B are schematic diagrams of a sequence of exemplary steps for making an alternative exemplary electrical connector, in accordance with the invention. In this embodiment, the alternating layers of conductor and dielectric of the laminated stack differ in that the dielectric layer 20' includes a plurality of dielectric layers, i.e. optional dielectric insulating layers. Additional layers 22, 24 may be layers of the same dielectric adhesive material described above in relation to dielectric sheet and layer 20, and all of layers 22, 24 need not have, but may have, dielectric fillers to maintain spacing. Additional layers 22, 24 also preferably exhibit the same ranges of dielectric strength, dielectric constant and loss factor as described above, however, the dielectric characteristics of different layers 22, 24 may be selected to differ to obtain a desired dielectric property.

Exemplary layer 20' of the laminated stack 40' FIG. 2A includes three layers wherein outer layers 22 are of flexible dielectric adhesive as described above and central layer 24 is a thin sheet of dielectric polymer such as polyimide, polyester, polysulfone, polyethersulfone, polypropylene, or other polymer film. Preferably, such polymer film has a dielectric withstand voltage of at least 500 volts/mil (about 20 volts/$\mu$m) and a thickness in the range of about 5–100 $\mu$m (about 0.2–4 mils). In addition to the dielectric adhesives previously mentioned, types CB7150, TP7150 and ESP7450 from AI Technology are also suitable for optional dielectric insulating layer 24. Where layer 24 is a polymer that is not molecularly flexible, such as polyimide, it is utilized in the form of a thin sheet or film that can flex.

Laminated stack 40' is made by laminating sheets arranged in the sequence dielectric adhesive 22, dielectric film 24, dielectric adhesive 22, metal conductor 30, dielectric adhesive 22, dielectric film 24, and so forth. Slices 42' of laminated sheets as illustrated in FIG. 2B are cut or sliced from laminated stack 40' and are then stacked to form greater stack 50' and processed to form connector 10', all in like manner to that described in relation to FIGS. 1A–1E. Connector 10' may have a conductor pitch as fine as less than about 25 $\mu$m (about 1 mil).

Figure 3:
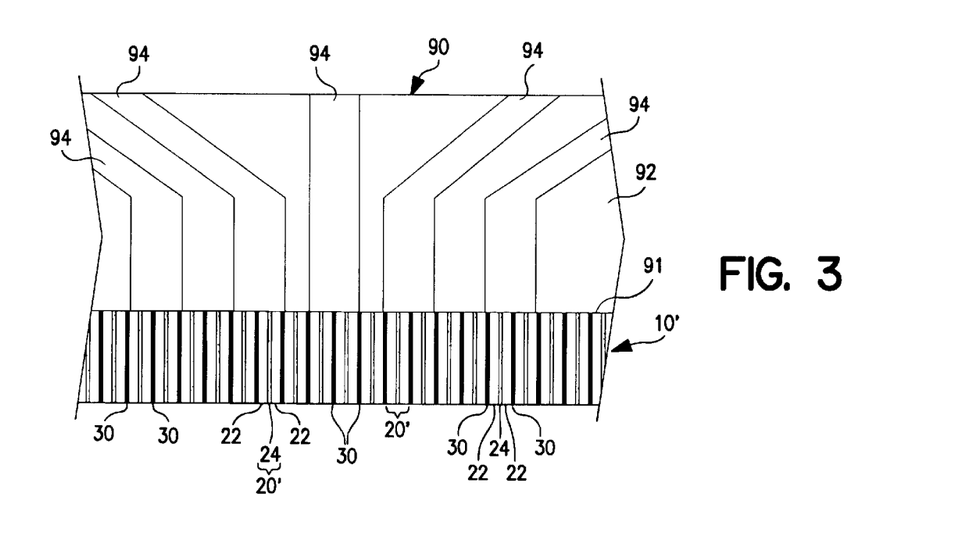
FIG. 3 is a schematic diagram of an exemplary embodiment of the invention employed in a fan-out arrangement.

FIG. 3 is a schematic diagram of an embodiment of the invention employed in a fan-out arrangement, such as with a conventional circuit device 90, such as a printed wiring circuit board or a conventional compressible electrical connector. Where circuit device 90 is a circuit board 90, circuit board 90 includes a substrate 92 such as of FR4 epoxy glass, ceramic or other conventional electronic substrate material on which are formed conductors 94 such as by etching of a copper sheet laminated to substrate 92. Where circuit device 90 is a conventional compressible connector 90, connector 90 includes conductive elastomer 94 between layers of dielectric elastomer 92. Conductors 94 are relatively closely spaced at edge 91 of circuit device 90 where they are in electrical contact with conductors 30 of flexible connector 10' and wherein electrical isolation between adjacent conductors 94 is maintained by the dielectric layers 20', 22, 24 of connector 10'. Conductors 94 are more widely spaced apart remote from the edge 91 of circuit device 90, thereby to fan out therefrom. Because the exposed ends of conductors 30 of connector 10' are contact areas 32 preferably of or coated by a noble or precious metal, such as nickel-gold on a copper conductor 30, they may be electrically connected to conductors 94, e.g., by thermo-compression bonding, by conductive adhesives including flexible conductive adhesives, or by soldering, preferably with a low-temperature solder, where the noble or precious metal is solderable as is indium, silver, gold, tin and the like. Connector 10' may have a conductor pitch as fine as less than about 25 $\mu$m (about 1 mil), and is suitable for use with circuit devices 90 having a comparable pitch or a much greater pitch, e.g., a standard pitch of about 125 $\mu$m (about 5 mils) or more.

Figure 4A:
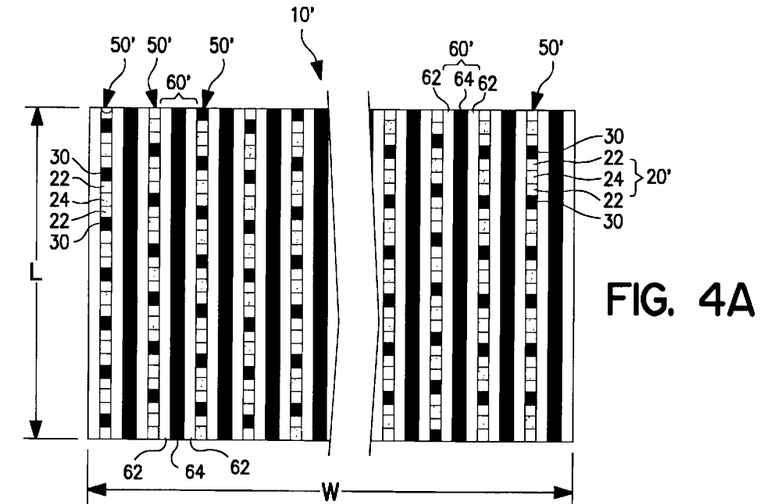
FIGS. 4A and 4B are an end view and a side view schematic diagram, respectively, of an exemplary electrical connector in accordance with the invention.
Figure 4B:
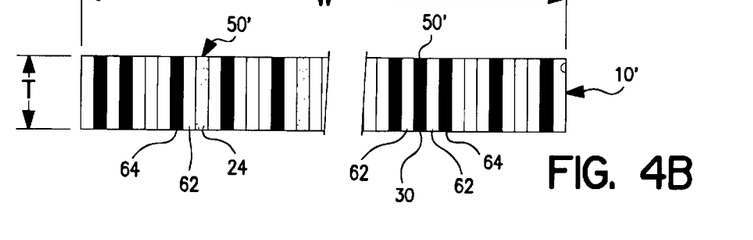

FIGS. 4A and 4B are an end view and a side view schematic diagram, respectively, of an exemplary electrical connector 10' in accordance with the invention. Connector 10' here is an electrical connection structure intended for use as an interposer 10' or as a testing membrane 10' as for a flip chip or other integrated circuit, and so is relatively larger and thicker than is a typical connector 10'. Each of conductors 30 thereof may have a length that is five or ten times its width in the case of a test membrane and may be substantially shorter, such as about the same as its width, in the case of an interposer. Interposer or membrane 10' has a relatively larger length L and width W (so as to encompass a large number of conductors 30) and a relatively longer thickness T (in the direction along the length of conductors 30) as compared to a typical connector 10'. To this end, a greater number of slices 42', 44, are stacked to form longer greater stacks 50' having a desired dimension and a greater number of greater stacks 50' are stacked and laminated side by side.

Greater stacks 50' are laminated together by adhesive layers 60' that, for example, each include a plurality of dielectric layers 62, 64. Dielectric layers 62 are of dielectric adhesive of like sort to that of layers 22 and dielectric layer 64 is a dielectric sheet or film of like sort to that of layer 24, with suitable dielectric properties, all as described above. As above, layers 22 and 62 are preferably flexible dielectric adhesive and optional layers 24 and 64 are preferably a thin film of polyimide.

For an exemplary connector 10, where conductors 30 are formed of so-called "¼-ounce" copper, i.e. a copper foil about 9–10 $\mu$m thick (about 0.35–0.4 mil thick), slices 42', 44' may be cut to a width of about 50 $\mu$m (about 2 mils) and have a length of about 50–250 $\mu$m (about 2–10 mils), typically at or near the shorter end of the range in the case of an interposer and at or near the longer end of the range in the case of a test membrane. Layers 22, 24, 62, 64 and dielectric films 24, 64 thereof are each about 12.5 $\mu$m (about 0.5 mil) or less thick. The resulting interposer or membrane 10' will have conductors 30 of about 10×50 $\mu$m (about 0.4×2 mils) and have a conductor pitch of about 75–100 $\mu$m (about 3–4 mils). Other thickness of materials may also be utilized, such as "½-ounce" copper which is about 18 $\mu$m (about 0.7 mil) thick and 7–8 $\mu$m (about 0.3 mil) thick polyimide.

Figure 5:
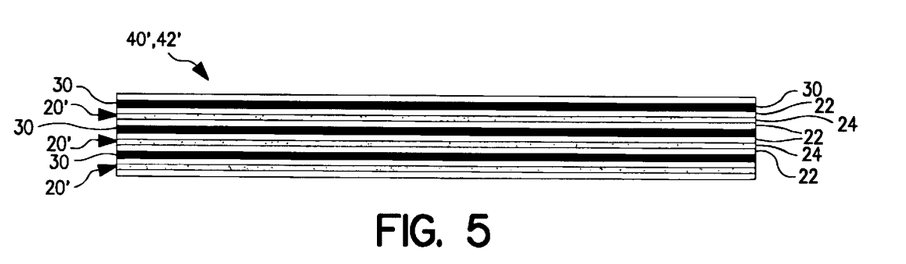
FIG. 5 is a side view schematic diagram of an exemplary laminate structure useful in making the invention.
Figure 6:
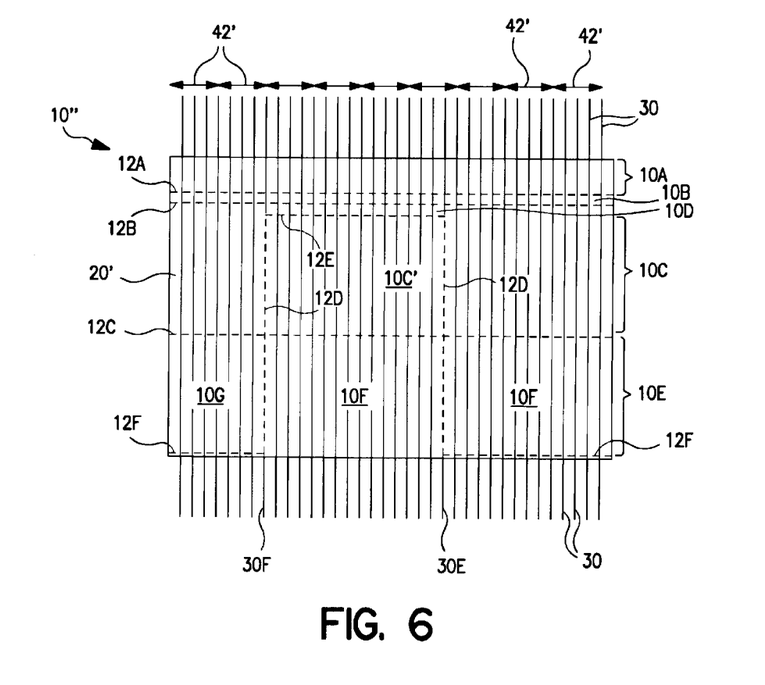
FIG. 6 is an end view schematic diagram of an electrical connector in accordance with the invention.

A method according to the invention is described in relation to FIG. 5 which is a side view schematic diagram of an exemplary laminate structure 40' useful in making the electrical connection structure of the invention, and FIG. 6 which is a side view schematic diagram of an electrical connector 10' in accordance with the invention. The method is described in terms of the general dimensions and materials for example, of the exemplary connector described in the immediately preceding paragraph. Dielectric adhesive film 22 is deposited on both surfaces of the optional dielectric sheet or film 24, if utilized, to provide adhesive layer 20'. Metal sheets 30 are longer at least in the direction illustrated so that at least one edge thereof, or two opposite edges thereof as illustrated, extend beyond the edge(s) of dielectric adhesive 22 and optional dielectric sheet 24. This may be accomplished by using smaller sheets of dielectric adhesive 22 and dielectric sheet 24 when laminating laminate 40, 40' or by not depositing dielectric adhesive near the edge(s) of metal sheet 30.

Suitable dielectric adhesives include AI Technology's flexible dielectric adhesive types ESP7450 and CB7130. The adhesive is deposited, e.g., to a thickness of about 12.5 $\mu$m (about 0.5 mil) and B-staged, first on one side of, e.g., polyimide layer 24 and then on the other side thereof. If optional dielectric sheet 24 is not utilized, dielectric adhesive layer 20 is provided of the foregoing adhesives with suitable dielectric fillers such as silica or fused silica of micron-level size, e.g., about 10 $\mu$m (about 0.4 mil), to serve as spacers to ensure proper dielectric spacing between adjacent conductor layers 30.

Metal conductive sheets 30 and adhesive layers 20 or 20' are stacked in alternating fashion and are laminated at a temperature in the range of about 80–200° C. using rubber cushioned heated rollers tensioned to compress the stacked layers 20, 20', 30 by a suitable spring force to form laminated stack 40. A release liner, such as a Teflon® sheet, may be utilized as the top and bottom sheets of the stacked layers 20, 20', 30 or as a cover for the heated rollers to proper release of the adhesive laminate stack 40', 40. The stack lamination is preferably performed at as low a temperature and in as short a time (e.g., a few minutes) as will properly adhere the laminated metal sheets 30 and adhesive layers 20, 20' to one another, without causing premature curing of the adhesive of adhesive layer 20, 20' if the adhesive is a thermosetting adhesive. Conductors 30 protrude from laminate 40, 40' for facilitating the making electrical contact to metal sheets 30 for electrolytically plating an oxidation-resistant metal coating thereon.

Laminated stack 40, 40' is then slit or die-cut into strips 42, 42' of a suitable width (e.g., at least as wide as the thickness of the laminated stack) which are then stacked with their respective conductor layers 30 parallel to each other and bonded together with like adhesive to form laminated stacks 50, 50' as described above. The laminating of strips 42, 42' into stacks 50, 50' is performed under like temperature and pressure as described above. The thickness of laminated stack 40, 40' is typically kept to below 250 $\mu$m (about 10 mils) so that the slitting or die-cutting produces a reasonably sharp or clean-cut edge. A stack 50, 50' of number N slices 42, 42' is typically about N×250 $\mu$m (about N×10 mils) high. Metal layers 30 may be made slightly longer or wider than dielectric layers 20, 20' so as to leave the ends of metal conductors 30 slightly more exposed to facilitate plating an oxidation-resistant metal, such as a precious or noble metal, thereon, e.g., as where electrical contact thereto is desired for electrolytic plating.

Stacks 50, 50' are aligned in side-by-side fashion separated by dielectric adhesive layers 60, 60' and are bonded together by adhesive layers 60, 60' to form connectors 10, 10' under like temperature and pressure as described above. When bonding stacks 50, 50' together with the flexible dielectric adhesive layers 60, 60', pressure is applied in a lateral direction, i.e. so as to press stacks 50, 50' and adhesive layers 60, 60' together, while constraining stacks 50, 50' against movement in the Z-axis direction, i.e. along the lengths of conductors 30 so that the ends thereof remain substantially in the same plane. The oxidation resistant metal coating 32, such as nickel-gold on copper conductors 30, may be plated or otherwise applied to the exposed ends of conductors 30 either before or after stacks 50, 50' are laminated together to form connector 10, 10'.

The thickness of connector 10, 10' after stacks 50, 50' are laminated together often is not the desired thickness, and typically is much greater than the desired thickness. Similarly, the length and width of connector 10, 10' after stacks 50, 50' are laminated together often are not the desired length and width, and typically are much greater than the desired length and width. Also typically, and often preferably, the laminated stacks 50, 50' are made much thicker, longer and/or wider than the desired connector 10, 10' so that a block from which a plurality of connectors 10, 10' can be cut are made at one time. Individual connectors 10, 10' are slit or die-cut in a plane substantially perpendicular to the length of conductors 30 (i.e. transverse to the Z-axis direction) to separate connectors 10, 10' (or slices thereof comprising one or more of such connectors) of the desired thickness. Where the length and/or width of such slices is greater than the desired length and/or width, such slices may be slit or die-cut at intervals corresponding to the desired length and/or width to separate one or more connectors 10, 10 of the desired length, width and/or thickness.

As illustrated in FIG. 6, for example, exemplary connectors 10A, 10B, 10C, 10D, 10E and 10F may be provided. Bulk connector 10" is formed by laminating a plurality of laminate slices 42', as indicated by the double-ended arrows, leaving the exposed edges of conductors 30 extending therefrom. Bulk connector 10" is cut along cut lines 12A and 12B to provide flexible connectors 10A and 10B that are as wide and long as is bulk connector 10". Connector 10A is of moderate thickness and large width and length such as may be useful, e.g., in connecting to a electronic substrate, large integrated circuit, semiconductor wafer and the like as a test membrane, while connector 10B is of like length and width but of lesser thickness as may be useful, e.g., in attaching such electronic devices to a larger substrate for operation. Slicing along cut line 10C produces connector 10C of greater thickness as might be useful, e.g., as a connector or jumper between electronic substrates, and any one or more of connectors 10C may be further sliced or cut at one or both of cut lines 12D in a direction along conductors 30E and 30F, respectively, to provide connectors of lesser width and/or length. Further, any one or more of such further cut connectors 10C' such as the one cut from the region between lines 12D may be further sliced along cut line 12E to provide a connector 10D of smaller width and length (between conductors 30E and 30F) and also of lesser thickness, as maybe useful, e.g., in attaching an integrated circuit or other electronic component to a substrate in a flip-chip manner.

Bulk connector 10" is cut along cut lines 12C and 12E to provide flexible connector 10E that is as wide and long as is bulk connector 10", and of substantial thickness as is connector 10C. Further, connector 10E may be cut along cut lines 12D to provide connectors 10F and 10G of lesser width and length. Connector 10E is of greater thickness and large width and length such as may be useful, e.g., as a connector or jumper for connecting electronic substrates, printed circuit wiring boards, and the like. Connectors 10F and 10G are also of greater thickness but of lesser length and width (between an edge of connector 10" and one of conductors 30E and 30F) as may be useful, e.g., as a connector or jumper for such electronic substrates and wiring boards or in connecting electronic devices to a larger substrate for operation. Other sizes and thicknesses of electrical connection structures, such as connectors or jumpers or test membranes or interposers, may be made by selecting appropriate cut lines at which to slice or cut bulk connector 10".

At the level of slices and/or separated connectors 10, 10' and after the oxidation resistant coating, if any, is applied to the exposed ends of conductors 30 that require same, a pattern of bumps of suitable solder paste (such as tin-lead or other low-melting point solder)or electrically conductive adhesive may be applied on the ends of conductors 30 for making connection to an electronic device and/or substrate with which connector 10, 10' is to be utilized, e.g. as by melt-flow bonding of the adhesive or reflow of the solder. Where thermosetting adhesive is utilized, connector 10, 10' may be heated to a higher temperature for the curing thereof, either as a connector or in conjunction with an electronic substrate with which it is to be utilized. In such case, the adhesive of adhesive layers 20, 20' of connector 10, 10' may provide mechanical attachment of connector 10, 10' to such substrate (in addition to the adhesion provided by the electrically-conductive adhesive connections or solder connections) without the need for mechanical clips or clamps.

While each slice or connector 10, 10' may be considered as such, it is a anisotropically conductive sheet conductive in the direction only between the opposite ends of conductors 30, i.e. along the "z-axis" and may be utilized as such.

Such anisotropically conductive sheets are often referred to as being Z-axis conductive. When utilized as a connector or jumper, the thickness thereof (i.e. the length of conductors 30) is selected as to be suitable for the dimension of the jumper or connector needed. The ratio of the height to width and/or thickness of the conductor 30 (i.e. the aspect ratio of the conductor) can be as much as five or ten to one, or even 20 to one or greater. Connectors with greater aspect ratios are often preferred as test membranes for connecting an electronic device to a test apparatus on a temporary basis while electrical testing is performed. Connectors including dielectric polymer sheets 24, 64 may provide higher dielectric voltage strength beneficial for such testing.

Where the connectors 10, 10' are to be utilized for the attachment and bonding of so-called "flip-chip" electronic devices, the slices are cut to a thickness of about 25–250 μm (about 1–10 mils), preferably about 50–250 μm (about 2–10 mils). Adhesive, mechanical or solder electrical connection bonding is suitable for flip-chip bonding, such as where the connector is utilized as an interposer.

Figure 7A:
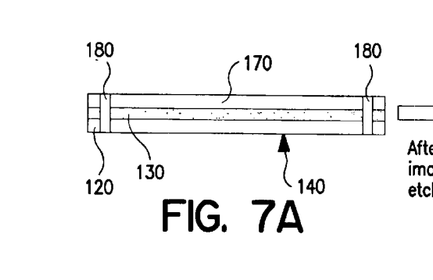
FIGS. 7A and 7B are side view cross-sectional and plan view schematic diagrams, respectively, of an alternative exemplary embodiment of conductive elements of an electrical connector in accordance with the invention.
Figure 7B:
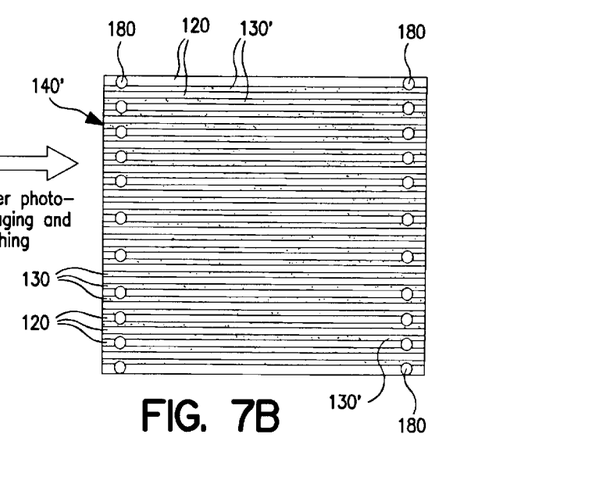

FIGS. 7A and 7B are side view cross-sectional and plan view schematic diagrams, respectively, of an alternative exemplary embodiment of conductive elements 130 of an electrical connector 110 in accordance with the invention. Laminate 140 includes layer 120 of flexible dielectric adhesive on a thin metal foil 130. Flexible dielectric adhesive 120, such as types ESP7450, CC7450 and RTK7550 available from AI Technology, may be in the form of a liquid or paste deposited by any suitable method onto metal foil 130 or may be in the form of a sheet or film of dielectric adhesive that is laminated to metal foil 130, in either case as thin as about 12 μm (about ½ mil) or less. Metal foil 130 is typically a copper or copper alloy foil available in a "¼-ounce" thickness (e.g., about 10 μm or 0.4 mil thick) or thicker. Typically, the conductor and adhesive, and an optional dielectric sheet or film, if utilized, should be as thin as available so as to obtain the finest conductor pitch. Thus the thickness of the laminate of adhesive 120 and metal foil 130 is about 22 μm, less than 25 μm (less than about 1 mil).

Laminate 140 also includes a photoresist layer 170 deposited on the surface of metal foil 130 opposite the surface to which dielectric adhesive 120 is applied. Photoresist 170 is exposed through a photo-etch mask, developed and patterned to define a plurality of parallel channels for etching metal foil 130 to provide a plurality of narrow parallel conductors 130' of desired dimension. Typically, the width of conductors 130' is about the same as or slightly greater than the thickness of metal foil 130, e.g., typically about 12–250 μm (about 0.5–10 mils), with the smaller dimension preferred for finer pitch. After etching of metal foil 130, photo-etch layer 170 is removed in conventional manner. Optionally, parallel conductors 130' may be plated with suitable oxidation-resistant metallization, such as silver, nickel-gold, nickel-palladium and the like.

Where it is desired to have conductors 130' of various layers of laminate 140' aligned when later stacked for lamination, judicial guide holes 180 or other suitable alignment features or indicia may be provided for defining the position of the photoetch mask with respect to laminate 140 and later for aligning plural laminates 140' as described below. Further, while straight parallel conductors 130' are illustrated, it may be desirable for conductors to be disposed at any desired angle or orientation with respect to guide holes 180 or to be other than straight, such as being a wave-like or "S"-shaped conductors for having a greater compressibility and/or springiness when utilized in the flexible connector of the invention, thereby to complement the molecular flexibility of the flexible dielectric adhesives utilized.

Figure 8:
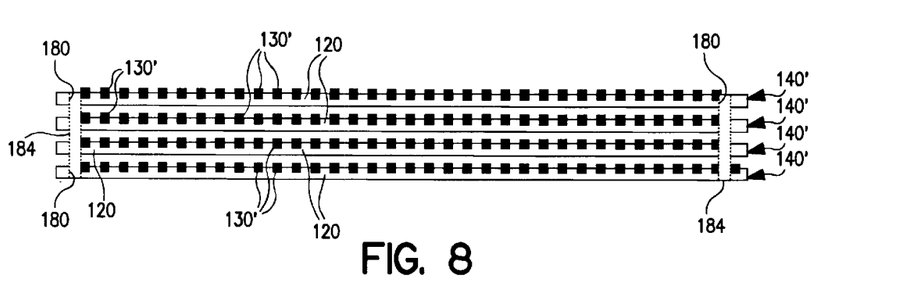
FIG. 8 is an end view cross-sectional schematic diagram of a plurality of the elements of FIGS. 7A and 7B arranged for laminating.

FIG. 8 is an end view cross-sectional schematic diagram of a plurality of the laminate elements 140' of FIGS. 7A and 7B arranged for laminating. Laminates 140' are stacked with their respective alignment or guide holes 180 aligned and with guide pin 184 therethrough for maintaining the desired alignment as laminates 140' are brought together under suitable pressure and at a suitable temperature for lamination. Virtually any desired number of laminates 140' may be stacked, e.g., between 10 and 1000 layers, either all at once or in a sequence of laminating steps to build up to the desired number of layers, e.g., utilizing guide holes 180. Dielectric adhesive layers 120 may be of sufficient thickness so that when laminated they fill in the spaces between adjacent ones of conductors 130' or such spaces may optionally be filled with additional dielectric adhesive of like or similar type prior to lamination.

The resulting laminate block may be, e.g., from about 1 mm (about 40 mils) thick to several centimeters thick, and may be separated transverse to the length direction of conductors 130' (i.e. perpendicular to the direction in which they are parallel) into slices that can be as thin as about 250 $\mu$m (about 10 mils) thick or less, depending upon the tool(s) utilized. Conductors 130' in each such slice may have an aspect ratio of length to width (or diameter) of 5:1 for a thinner slice, and to 20:1 or 100:1 for a thicker slice such as may be utilized as test membrane. Typically, laminates 140' having conductors 130' of like size and pitch are stacked so that conductors 130' thereof are parallel and aligned one against the other, however, such uniformity and/or alignment is not necessary and may be dispensed with, either intentionally or by happenstance, as desired. Uniform or non-uniform size (thickness and/or width) and pitch conductors 130' may be in an uncontrolled or random alignment and/or sequence, or may be in a predetermined alignment and/or sequence for providing a flexible connector having a desired predetermined distribution of conductors 130'. One example of such arrangement is described in relation to FIG. 11.

Laminates 140' may be of any convenient and workable size. Typically, a 30.5 by 30.5 cm (about 12 by 12 inch) pattern may be utilized as may be convenient or desirable, e.g., as for deposition of flexible dielectric adhesive 120, patterning of photoresist 170, etching of conductors 130', and/or laminating of laminates 140' and/or stacks thereof. Laminated stacks of laminates 140' of reasonable thickness may have relatively precisely positioned conductors 130' and dielectric layers 120, and may be cut, sliced, diced and/or excised into parallel slabs (connectors) of thickness typically from about 75 $\mu$m (about 3 mils) to one or more inches, depending upon the cutting tool utilized. If the desired flatness or parallelism of surfaces is not maintained to the desired or specified degree in the cutting or slicing, the resulting connectors 110 may be lapped or otherwise trimmed for the desired flatness and/or parallel structure.

Where the cutting and/or slicing thereof is of extremely fine dimension such as less than about 5–25 $\mu$m (about 0.2–1 mil) in width or thickness, precision slicing equipment such as that utilized in the separation (slicing) of semiconductor wafers into individual semiconductor die may be utilized. In such case, the working dimension of laminates 140, 140' may be limited to a 30.5 cm (about 12 inch) diameter circle or an about 20 by 20 cm (about 8 by 8 inch) panel as is typical of such conventional semiconductor wafer slicing equipment.

Figure 9:
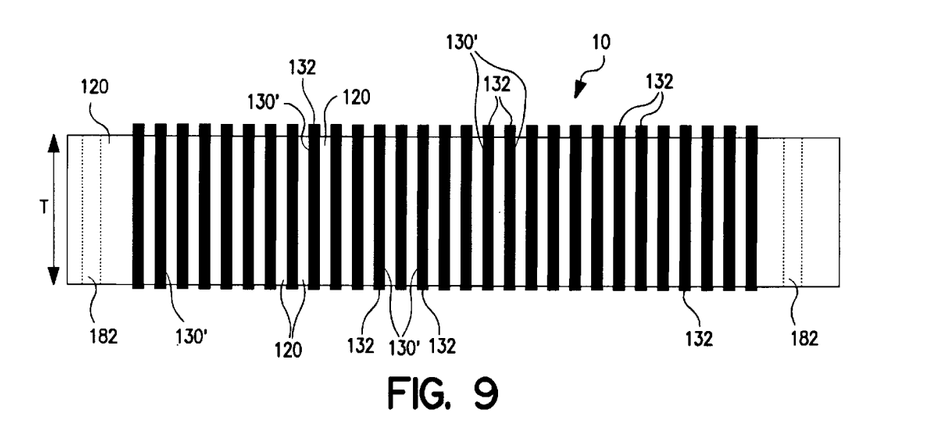
FIG. 9 is a side view cross-sectional schematic diagram of the exemplary embodiment of an electrical connector of the elements of FIGS. 7A, 7B and 8 after laminating and slicing.

FIG. 9 is a side view cross-sectional schematic diagram of the exemplary embodiment of an electrical connector 110 of the elements of FIGS. 7A, 7B and 8 after laminating and slicing. Conductors 130' are typically about 9–17 $\mu$m (about 0.35–6.4 mils) wide and have exposed ends or terminations that may be plated, e.g., by electrolytic plating or electroless plating, with suitable oxidation-resistant and/or solderable metallization 132, typically, nickel-gold, nickel-palladium, nickel-silver, tin or solder, or other suitable metal. A nickel-gold termination 132 is most common, such as for testing membranes and most other electronic applications. In addition, optional guide holes 182 may be provided having a longitudinal axis parallel to that of conductors 130' as may be convenient, e.g., for aligning a screen or mask in relation to the exposed ends of conductors 130' as for depositing bumps of electrically conductive adhesive or solder paste thereon.

Suitable flexible dielectric adhesives for layers 120 have a low dielectric constant (e.g., less than 6), a high dielectric strength (e.g., greater than 300 volts/mil or about 12 volts/$\mu$m), a low modulus of elasticity (e.g., less than about 500,000 psi (about 35,000 kg/cm$^2$) and preferably less than about 100,000 psi (about 7,000 kg/cm$^2$)), high elongation before failure (e.g., more than 30%), and, optionally, a low glass transition temperature (e.g., $T_g$ less than 0° C.).

Figure 10:
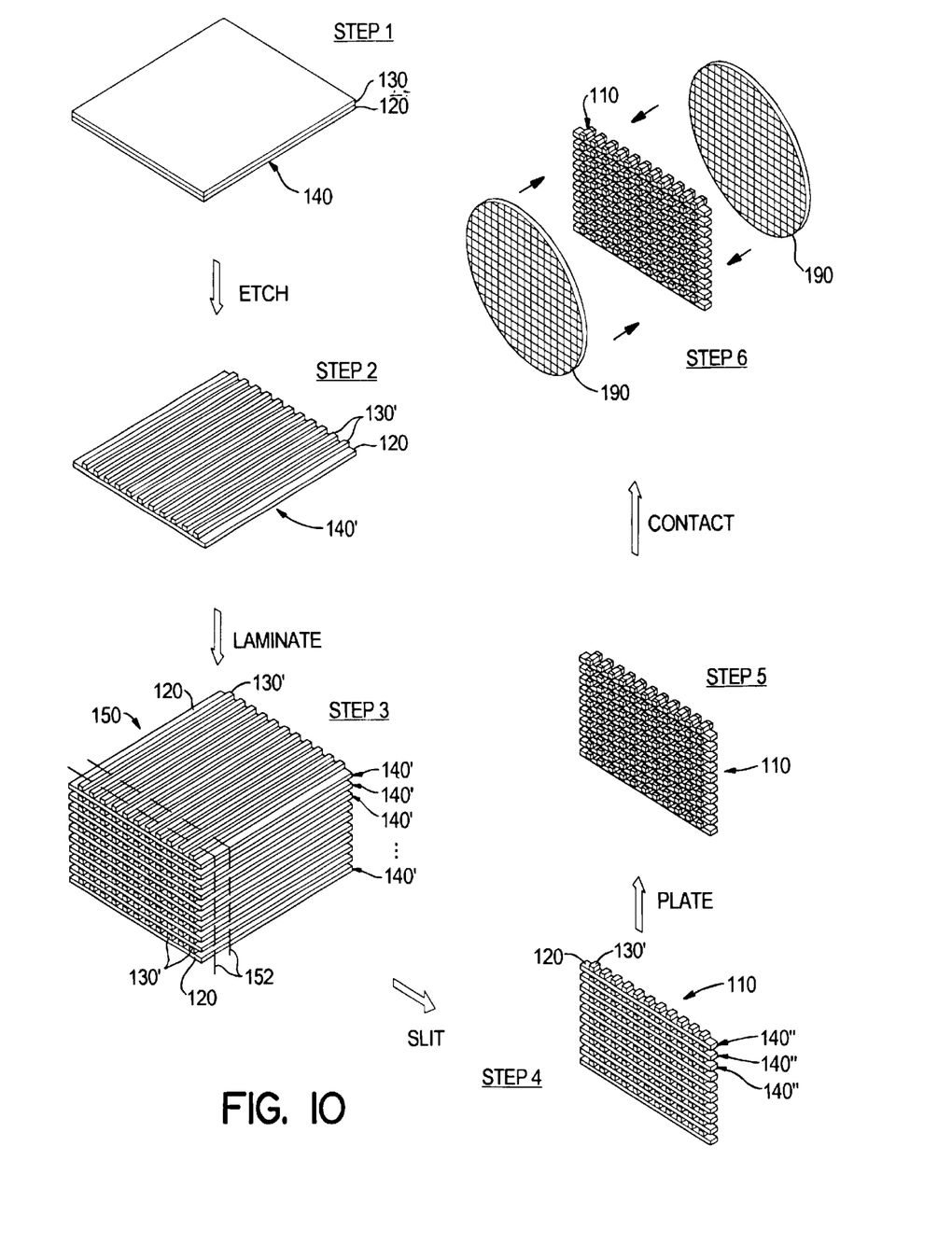
FIG. 10 is an isometric view schematic diagram illustrating a sequence of steps in making an exemplary electrical connector of the sort shown in FIGS. 7A through 9.

FIG. 10 is an isometric view schematic diagram illustrating a sequence of steps in making an exemplary electrical connector 110 of the sort shown in FIGS. 7A through 9. A laminate 140 of flexible dielectric adhesive 120 and metal foil 130 is made in step 1 and adhesive 120 is B-staged. Metal foil 130 is patterned to form conductors 130' of laminate 140' in step 2. A plurality of laminates 140' are stacked and laminated in step 3 to provide a laminated slab or stack 150 that is subsequently slit or cut, e.g., along cut lines such as line 152, in step 4 to provide a connector 110 with each cutting or slitting. Suitable guide holes (not visible) may be utilized if desired. The exposed ends of conductors 130' are optionally plated with an oxidation-resistant metallization (such as nickel-gold layers 132 on copper conductors 130') in step 5 to further provide connector 110, but may be plated at any other convenient step in the process. Thereafter, connector 110 is brought into contact with one or more electronic substrates 190 in step 6, such as the two semiconductor wafers 190 illustrated, and may be electrically connected thereto on a temporary basis such as by mechanical pressure in the case of a test membrane 110, or by a more permanent electrically-conductive mechanical connections, such as by bumps of electrically-conductive adhesive or solder in the case of a jumper, interposer or connector 110.

Because the exposed ends of conductors 130' with plating 132 thereon extend or project above the surface of flexible dielectric adhesive layers 120, connector 110 is easily direct bonded to a utilization article such as semiconductor wafer 190 by bumps of electrically-conductive adhesive or solder. For a connector/interposer 110 of large width and/or length, differences between the coefficients of thermal expansion of interposer/connector 110 and of the substrate such as a semiconductor wafer 190 or other substrate, electrical connections between conductors 130' of interposer 110 or connector 110 and contacts of the semiconductor wafer or other substrate 190 may be made using bumps of an electrically-conductive adhesive that cures at a temperature at or close to ambient temperature. This avoids temperature-induced misalignment of connections and/or stresses on the connections. Examples of such adhesives include types ESP7450, ESS8450 and ESP8450 flexible electrically conductive thermosetting adhesives available from AI Technology.

Figure 11:
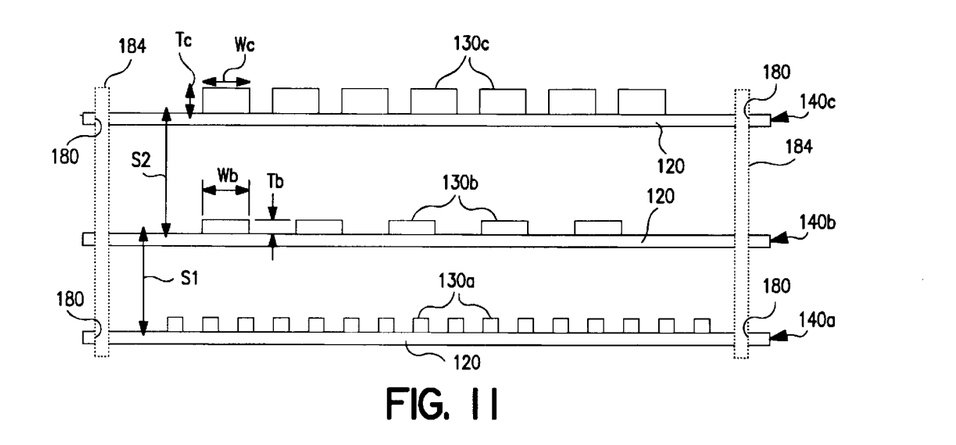
FIG. 11 is an end view cross-sectional schematic diagram of a plurality of alternative embodiments of the elements of FIGS. 7A and 7B arranged for laminating as in FIG. 8.

FIG. 11 is an end view cross-sectional schematic diagram of a plurality of different alternative embodiments 140a, 140*b*, 140*c* of the elements 140 of FIGS. 7A and 7B arranged for laminating as in FIG. 8. Laminate 140*a* has a plurality of parallel conductors 130*a* similar to those illustrated in FIGS. 7A, 7B and 8 above. Laminate 140*b* is similar to laminate 140*a* in that the thickness Tb of conductors 130*b* thereon is similar to that of conductors 130*a* and is different in that the width $W_b$ of conductors 130*b* is greater than that of conductors 130*a*. Laminate 140*c* is similar to laminate 140*b* in that the width $W_c$ of conductors 130*b* thereon is similar to that of conductors 130*b* and is different in that the thickness $T_c$ of conductors 130*c* is greater than that of conductors 130*b* and 130*a*. Similarly, the thicknesses of flexible dielectric adhesive layers 120*a*, 120*b*, 120*c* may be made the same or different to provide, in conjunction with the thicknesses of conductors 130*a*, 130*b*, 130*c*, a desired or predetermined conductor spacing in the directions indicated by doubleended arrows S1, S2 after laminating of laminates 140*a*, 140*b*, 140*c* together.

Alignment pins 184 through guide holes 180 in each of laminates 140*a*, 140*b*, 140*c* align the respective conductors 130*a*, 130*b*, 130*c* thereof in predetermined spatial relationship, if desired, such as for an interposer or connector for a specific electronic device or contact pattern.

Depending upon the application to which a flexible connector is to be put, connectors are excised from the laminated stack 150 in specific sizes (length and width) and thicknesses desired therefor. For a testing membrane, for example, the location of the thin, fine-pitch conductor elements is not critical. For an interposer for a specific semiconductor chip or other specific electronic interconnection, the positions of the conductors can be predisposed or predetermined by utilizing suitable die-cutting and/or dicing tools to obtain suitable excising positions, such as those commonly utilized in the semiconductor wafer processing industry.

Figure 12:
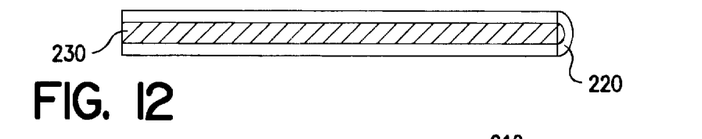
FIG. 12 is a side view cross sectional schematic diagram of an exemplary conductor useful in making the alternative embodiment of an electrical connector shown in FIGS. 13A and 13B.
Figure 13A:
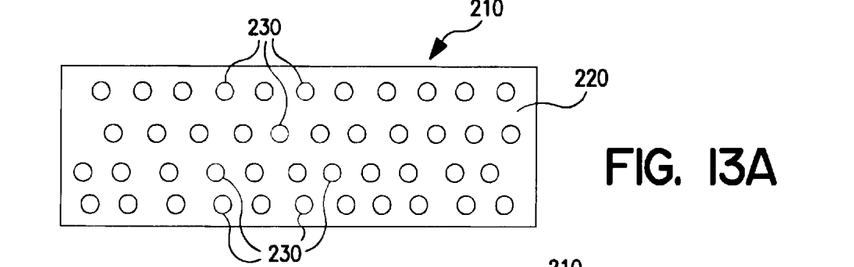
FIGS. 13A and 13B are a plan view schematic diagram and a side view cross-section schematic diagram of a further alternative embodiment of a flexible electrical connector in accordance with the invention.
Figure 13B:
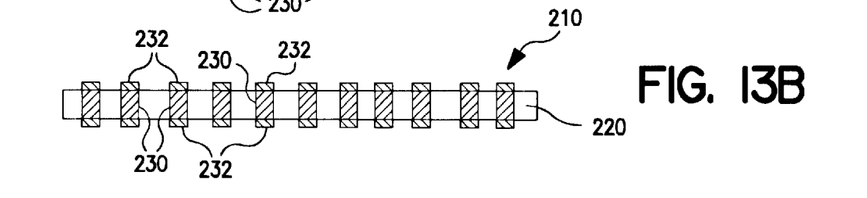

FIG. 12 is a side view cross sectional schematic diagram of an exemplary conductor 230 useful in making the alternative embodiment of an electrical connector 210 shown in FIGS. 13A and 13B. Connector 210 is formed of a plurality of long metal wires 230 that are each encased in a B-staged or dried molecularly flexible dielectric adhesive 220 and are then bundled together to form a bundle of coated wires 230 that are then sliced transverse to the length of wires 230 to produce flexible electrical connector 210.

Suitable fine diameter wires 230 such as wires of gold, nickel, silver, aluminum, silver, or other suitable metal or alloy, are first coated with a flexible dielectric adhesive 220. Suitable wires typically have a thickness or diameter of about 250 $\mu$m (about 10 mils) or less, and more typically less than about 50 $\mu$m (about 2 mils), with thinner wires 230 being utilized to obtain finer conductor pitch, and wires of about 12.5 $\mu$m (about ½ mil) diameter may also be utilized. Wires 230 are dipped into, sprayed with or otherwise coated with the liquid form of a suitable flexible dielectric adhesive 220 to be encased in flexible dielectric coating 220 which is then B-staged or dried to dryness without curing the adhesive.

Suitable flexible dielectric adhesives are molecularly flexible and have compressibility of about 10%, and dry to the touch when B-staged. More preferably, such flexible dielectric adhesives have a modulus of elasticity of less that about 7000 kg/cm$^2$ (about 100,000 psi) and compressibility of more than 30%. Such adhesives include types TP7130, ESP7450 and ESP7550 available from AI Technology and designated as LTP7130, LESP7450 and LESP7550 in their liquid form. Suitable dielectric fillers are included in the dielectric adhesive to maintain spacing, i.e. spatial separation, between adjacent wires. Suitable fillers include 34–45% by volume of spherical fillers of suitable diameter, such as 22–35 $\mu$m (about 0.87–1.38 mils) particles of quartz or alumina for wire spacing (pitch) of about 50 $\mu$m (about 2 mils) or greater. Smaller particles are utilized for finer pitch, such as particulate diameter of about 12 $\mu$m (about 0.5 mil) or less for wire spacing of about 25 $\mu$m (about 1 mil).

Wires 230 coated with B-staged flexible dielectric adhesive 220 are then bundled together to for a bundle of a specific size and shape, e.g., a square or rectangular shape. The bundle of wires 230 is compressed under suitable heat and pressure to melt flow the adhesive coatings 220 into a unitary matrix of flexible dielectric adhesive 220' having the many thin wires 230 embedded therein in generally parallel orientation. The unitary bundle is then sliced into thin slices 210 transversely to the wires 230, and each of the thin slices 210 is a connector 210 as illustrated by FIGS. 13A and 13B which are a plan view schematic diagram and a side view cross-section schematic diagram thereof.

Further, each of the thin slices or connectors 210 may then be diced into smaller connectors. Preferably, the unitary bundle is cooled to a temperature below the glass transition temperature of the adhesive 220', by cryogenic cooling is necessary, to facilitate the slicing or dicing. Optionally, a coating of precious metal 232 may be applied to each exposed end of a conductor 230 that is not a precious metal, such as a silver or a nickel-gold coating for a copper or aluminum conductor 233, and a gold flash or other precious metal for nickel conductors 230.

Figure 14A:
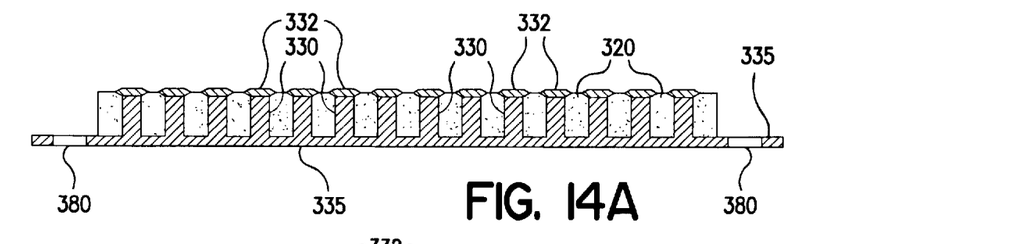
FIGS. 14A and 14B are side view cross-section schematic diagrams of a further alternative embodiment of a flexible electrical connector in accordance with the invention.
Figure 14B:
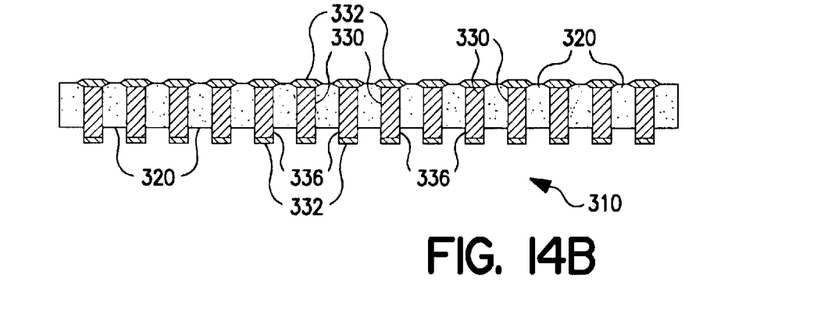

FIGS. 14A and 14B are side view cross-section schematic diagrams of a further alternative embodiment of a flexible electrical connector in accordance with the invention, and in particular, of an alternative step in the making of a an exemplary high aspect ratio interposer 310 according to the invention, and is usable for obtaining an aspect ratio of at least three, or higher. A sheet of metal 335 is provided that can receive thin wires 330 bonded thereto such as by heat and/or ultrasonic welding using a conventional wire bonder. Typically, the metal sheet 335 is a panel or is in strip or roll form and is advanced linearly in steps into the work space of a conventional wire bonder which welds bond wires 330 thereto in a row-by-row fashion, and/or in a desired pattern and spacing. Suitable metal sheets 335 include, e.g., copper, aluminum and alloys thereof of suitable thickness. Suitable wire 330 includes thin gold, copper and aluminum wire, such as that utilized in connecting to the contacts of semiconductor die. The bonded thin wire 330 is cut off at a desired length by the wire bonder to provide columnar conductors 330 perpendicular to metal sheet 335. Metal sheet 335 may include holes 380 which serve as guide holes for aligning sheet 335 with respect to the work space of the wire bonder and/or deposition masks or stencils described below, and which may be sprocket or drive holes for advancing sheet 335.

A flexible dielectric adhesive 320 is deposited on metal sheet 335 surround the thin wire columnar conductors 330, such as by mask deposition, stenciling, screen printing, roll coating or laminating, as desired. Dielectric adhesive 320 is dried, B-staged and/or cured so as to provide sufficient strength to support and electrically isolate conductors 330 after sheet 335 is removed and/or etched, and to resist the chemicals and solvents utilized in the etching of metal sheet 335. If copper wires 330 are employed, the ends or tips thereof should be coated with an oxidation resistant metal 332, e.g., a noble or precious metal such as silver, nickel/gold, palladium or the like, preferably prior to depositing dielectric adhesive 320 into the volume between the bonded wires 330, as illustrated in FIG. 14A.

After deposition of dielectric layer 320, metal sheet 335 is etched away in a pattern that removes the web portions of metal sheet 335, i.e. all of metal sheet 335 except where wires 330 are attached to metal sheet 335, and leaves an additional length of columnar conductor 336 on the end of each columnar conductor 330, thereby providing a higher aspect ratio conductor. The exposed ends of columnar conductors 336 are preferably plated with a precious or noble metal as described. Thus, the resulting connector or interposer 310 shown in FIG. 14B is substantially like the connectors 10, 10', 110, 210 described above.

In a typical embodiment, interposer 310 includes a sheet 335 of "1–2 ounce" copper, i.e. copper having a thickness of about 35–75 $\mu$m (about 1.5–3 mils), to which gold or copper wires 330 of about 6–13 $\mu$m (about ¼–½ mil) diameter are bonded to extend substantially perpendicularly therefrom. Suitable dielectric adhesives 320 include types TP7150 and TP7090 thermoplastic adhesives and types ESP7450, ESP7450-SC, ESP7550, ESP7670 and ESP7670-SC thermosetting adhesives, available from AI Technology. When such thin or superfine bond wires 330 are employed, the patterning and etching of metal sheet 335 to leave conductor extensions 336 may utilize semiconductor grade photoimaging.

It is noted that an interposer 310 using such thin (e.g., about 6–13 $\mu$m (about ¼–½ mil) diameter) bond wires 330 may have the bond wires 330 placed in an electrically-isolated pattern corresponding to an electronic device to which it is to be attached or may have the thin bond wires 330 placed in a closely-spaced, fine-pitch, substantially uniform electrically-isolated pattern so as to produce an interposer 310 that may be utilized as a Z-axis or anisotropically conductive dielectric sheet. In such case, the dielectric adhesive may be either rigid or flexible, comparable to conventional Z-axis adhesives such as AI Technology types ZEF8418 and ZEF8450.

Further, copper sheet 335 may be entirely etched away whereby the ends of the gold or copper thin bond wires 330 are exposed at both ends, the ends preferably being plated, if copper. Thicker diameter bond wires 330 may also be employed so as to provide larger diameter columnar conductors 330, e.g., in the range of about 25 $\mu$m to 2.5 mm (about 1–100 mils) in diameter. In addition, either surface of interposer 310 may receive bumps of electrically conductive adhesive for providing interconnection to the contacts of electronic devices, such as a pattern of flexible conductive adhesive bumps for bonding to contacts of a semiconductor die, preferably contacts having a precious metal layer.

While the present invention has been described in terms of the foregoing exemplary embodiments, variations within the scope and spirit of the present invention as defined by the claims following will be apparent to those skilled in the art. For example, the anisotropic or Z-axis conductive structures according to the invention may be made in a wide variety of sizes and shapes, and may be utilized as interposer, connectors, test membranes, jumpers and the like for making electrical connections between two or more electronic devices and/or substrates.

The spatial arrangement and cross-sectional size and pitch of the conductors of such structure may be made to correspond to the arrangement and pattern of contacts of such electronic devices and/or substrates. Alternatively, the spatial arrangement of the conductors of such structure may be of small size and fine pitch, and in either a regular or an irregular pattern, thereby to provide electrical connection between ones of the contacts of the two opposed electronic devices and/or substrates that are in corresponding opposing positions.

What is claimed is:

1. A method for making an electrical connection structure comprising:

providing a plurality of elongated metal conductors of an electrically-conductive metal;

placing the plurality of elongated metal conductors in generally parallel spaced-apart spatial relationship;

filling the spaces between the spaced apart elongated metal conductors with a molecularly flexible dielectric adhesive;

drying or B-staging the molecularly flexible dielectric adhesive;

whereby the plurality of elongated metal conductors are embedded in the dried or B-staged molecularly flexible dielectric adhesive; and cutting the dried or B-staged molecularly flexible dielectric adhesive and the elongated metal conductors embedded therein in a direction transverse to the elongated direction of the elongated metal conductors.

2. The method of claim 1 wherein said cutting further comprises, subsequent to said cutting in a direction transverse to the elongated direction of the elongated metal conductors, cutting the cut dried or B-staged molecularly flexible dielectric adhesive and the elongated metal conductors embedded therein in a direction generally parallel to the elongated direction of the elongated metal conductors.

3. The method of claim 1 wherein the electrically conductive metal includes at least one of copper, aluminum, brass, bronze, nickel, tin, indium, lead, zinc, silver, gold, and combinations and alloys thereof.

4. The method of claim 1 wherein said cutting includes one of cutting, die cutting, slicing and sawing.

5. The method of claim 1 wherein said cutting includes cooling the cut dried or B-staged molecularly flexible dielectric adhesive having the elongated metal conductors therein to a temperature less than a glass transition temperature of the molecularly flexible dielectric adhesive.

6. The method of claim 1 further comprising applying a layer of oxidation-resistant electrically-conductive metal on ends of the elongated metal conductors exposed by said cutting.

7. The method of claim 6 wherein said applying includes depositing at least one layer of a noble or precious metal including silver, gold, palladium, nickel, tin, solder, and combinations and alloys thereof.

8. The method of claim 1 wherein said placing and said filling comprise: interleaving alternating layers of the elongated metal conductor and of the molecularly flexible dielectric adhesive, and laminating the interleaved alternating layers of the elongated metal conductor and of the molecularly flexible dielectric adhesive together.

9. The method of claim 8 wherein said interleaving comprises depositing a layer of molecularly flexible dielectric adhesive on the elongated metal conductors and thereafter performing said drying or B-staging the molecularly flexible dielectric adhesive.

10. The method of claim 8 wherein said interleaving includes providing a sheet of the molecularly flexible dielectric adhesive after said drying or B-staging the molecularly flexible dielectric adhesive.

11. The method of claim 8 wherein said interleaving includes providing a sheet of dielectric polymer disposed between two layers of the molecularly flexible dielectric adhesive.

12. The method of claim 8 further comprising cutting the laminated interleaved alternating layers of the elongated metal conductor and of the molecularly flexible dielectric adhesive into at least two thin slices in a direction transverse to the elongated metal conductors, and stacking the at least two thin slices with the elongated metal conductors disposed in generally parallel relationship and with the elongated direction of the elongated metal conductors generally aligned.

13. The method of claim 12 further comprising bonding the stack of thin slices of claim 8 in side by side relationship with at least a second like stack of thin slices, said bonding including placing a layer of molecularly flexible dielectric adhesive therebetween.

14. The method of claim 13 wherein said placing a layer of molecularly flexible dielectric adhesive therebetween includes providing a sheet of dielectric polymer disposed between two layers of the molecularly flexible dielectric adhesive.

15. The method of claim 14 wherein the dielectric polymer includes polyimide, polyester, polysulfone, polyethersulfone, polypropylene, and polymer film.

16. The method of claim 8 wherein the layers of the elongated metal conductor are of greater dimension in at least one of their length and width than are the layers of the molecularly flexible dielectric adhesive, whereby at least one edge of the elongated metal layers extend beyond the edges of the molecularly flexible dielectric layers.

17. The method of claim 16 further comprising making electrical contact to the at least one edge of the elongated metal layers for electrolytically plating a precious metal or a noble metal on the elongated metal layers.

18. The method of claim 1 wherein said providing a plurality of elongated metal conductors includes providing a plurality of sheets of electrically conductive metal, and wherein said placing the plurality of elongated metal conductors is generally parallel spaced apart relationship comprises providing a layer of molecularly flexible dielectric adhesive on the sheets of electrically conductive metal, and patterning the sheet of electrically conductive metal to form the elongated metal conductors.

19. The method of claim 18 wherein said filling the spaces includes laminating the plurality of layers of molecularly flexible dielectric adhesive having patterned elongated metal conductors thereon.

20. The method of claim 18 wherein said filling the spaces includes depositing molecularly flexible dielectric adhesive between the patterned elongated metal conductors on the layer of molecularly flexible dielectric adhesive.

21. The method of claim 18 further comprising providing at least two guide holes in at least one of the layer of molecularly flexible dielectric adhesive and the sheets of electrically conductive metal, and placing a pin in the guide holes for aligning the at least one of the layer of molecularly flexible dielectric adhesive and the sheets of electrically conductive metal with at least one of the layers of molecularly flexible dielectric adhesive having patterned elongated metal conductors thereon and a stencil or mask.

22. The method of claim 18 wherein the elongated metal conductors formed on different ones of the plurality of layers of molecularly flexible dielectric adhesive having patterned elongated metal conductors thereon have elongated metal conductors differing in at least one of width and thickness.

23. The method of claim 1 wherein said providing a plurality of elongated metal conductors of an electrically-conductive metal includes providing a plurality of elongated metal wires having a length substantially greater than a diameter thereof, and wherein said filling the spaces between the spaced apart elongated metal conductors includes coating the elongated thin metal wires with a molecularly flexible dielectric adhesive.

24. The method of claim 23 wherein the elongated metal wires include wires of at least one of copper, aluminum, brass, bronze, nickel, tin, indium, lead, zinc, silver, gold, and combinations and alloys thereof.

25. The method of claim 23 wherein said placing the plurality of elongated metal conductors in generally parallel spaced-apart spatial relationship includes bundling the coated elongated metal wires.

26. The method of claim 1 wherein said providing the plurality of elongated metal conductors comprises providing a sheet of electrically-conductive metal, and wire-bonding a plurality of electrically-conductive wires on one surface thereof in generally parallel spaced apart spatial relationship.

27. The method of claim 26 wherein said providing a plurality of elongated metal conductors includes, after said filling the spaces, removing at least that part of the sheet of electrically-conductive metal to which the electrically-conductive wires are not wire-bonded.

28. The method of claim 27 wherein said removing includes one of mechanical removal and chemical etching.

29. The method of claim 27 further comprising applying a layer of oxidation-resistant electrically-conductive metal on ends of the electrically-conductive wires exposed by at least one of said cutting and said removing.

30. The method of claim 1 further comprising placing the cut dried or B-staged molecularly flexible dielectric adhesive having the elongated metal conductors therein against an electronic device having plural contacts thereon with ones of the elongated metal conductors in electrical contact with ones of the plural contacts.

31. The method of claim 30 further comprising providing bumps of one of solder and an electrically-conductive adhesive on at least one of the elongated metal conductors and the plural contacts for making electrical connection therebetween.

32. The method of claim 30 wherein said electronic device includes one of a semiconductor wafer, a semiconductor die, a flip-chip, an electronic component, an integrated circuit, an electronic substrate, a ceramic substrate, a circuit board, and a printed wiring circuit board.

33. The method of claim 30 wherein the cut dried or B-staged molecularly flexible dielectric adhesive having the elongated metal conductors therein is utilized as one of an electrical jumper, an electrical interposer, an electrical test membrane an electrical connector, an anisotropically electrically-conductive structure and a Z-axis electrically conductive structure.

34. The electrical connection structure made in accordance with claim 1 wherein the elongated metal conductors have a thickness and a width of less than 250 $\mu$m.

35. The electrical connection structure made in accordance with claim 34 wherein the elongated metal conductors have a length that is at least two times the thickness or width thereof.

36. The electrical connection structure made in accordance with claim 1 wherein the elongated metal conductors have one of a thickness and a width of less than 25 $\mu$m.

37. The electrical connection structure made in accordance with claim 36 wherein the elongated metal conductors have a length that is at least two times the thickness or width thereof.

38. A method for making an electrical connection structure comprising:
   providing a plurality of sheets of an electrically-conductive metal;
   providing a plurality of layers of molecularly flexible dielectric adhesive;
   drying or B-staging the molecularly flexible dielectric adhesive;
   interleaving alternating layers of the sheets of electrically-conductive metal and of the layers of molecularly flexible dielectric adhesive,
   laminating the interleaved alternating layers of the sheets of electrically-conductive metal and the layers of molecularly flexible dielectric adhesive together,
   whereby the plurality of sheets of electrically-conductive metal are embedded in the dried or B-staged molecularly flexible dielectric adhesive;
   cutting from the laminated interleaved alternating layers of the sheets of electrically-conductive metal and of the molecularly flexible dielectric adhesive at least two thin slices in a direction transverse to the sheets of electrically-conductive metal;
   stacking the at least two thin slices with the cut sheets of electrically-conductive metal disposed in generally parallel relationship and with an elongated direction of the cut sheets of electrically-conductive metal generally aligned; and
   cutting the dried or B-staged molecularly flexible dielectric adhesive and the cut sheets of electrically-conductive metal embedded therein in a direction transverse to the elongated direction of the cut sheets of an electrically-conductive metal.

39. The method of claim 38 wherein said providing a plurality of layers of molecularly flexible dielectric adhesive comprises depositing the layer of molecularly flexible dielectric adhesive on the sheets of electrically conductive metal conductors and thereafter performing said drying or B-staging the molecularly flexible dielectric adhesive.

40. The method of claim 38 wherein said interleaving includes stacking the sheets of electrically conductive metal having the layer of molecularly flexible dielectric adhesive thereon.

41. The method of claim 38 wherein said providing a plurality of layers of molecularly flexible dielectric adhesive includes providing a plurality of sheets of the molecularly flexible dielectric adhesive after said drying or B-staging the molecularly flexible dielectric adhesive.

42. The method of claim 38 wherein said interleaving further includes providing a sheet of dielectric polymer disposed between two layers of the molecularly flexible dielectric adhesive.

43. The method of claim 38 further comprising bonding the stack of thin slices in side by side relationship with at least a second like stack of thin slices, said bonding including providing a layer of molecularly flexible dielectric adhesive therebetween.

44. The method of claim 38 wherein the sheets of electrically conductive metal are of greater dimension in at least one of their length and width than are the layers of the molecularly flexible dielectric adhesive, whereby at least one edge of the sheets of electrically-conductive metal extend beyond the edges of the molecularly flexible dielectric layers.

45. The method of claim 38 further comprising applying a layer of oxidation-resistant electrically-conductive metal on ends of the sheets of electrically conductive metal exposed by said cutting.

46. The method of claim 38 wherein said cutting includes cooling the dried or B-staged molecularly flexible dielectric adhesive to a temperature less than a glass transition temperature of the molecularly flexible dielectric adhesive.

47. The method of claim 38 further comprising providing at least two guide holes in at least the layer of molecularly flexible dielectric adhesive, and placing a pin in the guide holes for aligning at least the layer of molecularly flexible dielectric adhesive with at least one of the layers of molecularly flexible dielectric adhesive having patterned elongated metal conductors thereon and a stencil or mask.

48. The method of claim 43 wherein said placing a layer of molecularly flexible dielectric adhesive therebetween includes providing a sheet of dielectric polymer disposed between two layers of the molecularly flexible dielectric adhesive.

49. The method of claim 48 wherein the dielectric polymer includes polyimide, polyester, polysulfone, polyethersulfone, polypropylene, and polymer film.

50. A method for making an electrical connection structure comprising:
   providing a plurality of sheets of electrically conductive metal;
   providing a layer of molecularly flexible dielectric adhesive on the sheets of electrically conductive metal;
   drying or B-staging the molecularly flexible dielectric adhesive;
   patterning the sheet of electrically conductive metal to form a plurality of generally parallel elongated metal conductors;
   stacking and laminating the plurality of layers of molecularly flexible dielectric adhesive having patterned elongated metal conductors thereon together;
   whereby the plurality of elongated metal conductors are embedded in the dried or B-staged molecularly flexible dielectric adhesive; and
   cutting the dried or B-staged molecularly flexible dielectric adhesive and the elongated metal conductors embedded therein in a direction transverse to the elongated direction of the elongated metal conductors.

51. The method of claim 50 further comprising applying a layer of oxidation-resistant electrically-conductive metal on ends of the elongated metal conductors exposed by said cutting.

52. The method of claim 50 wherein said cutting includes cooling the dried or B-staged molecularly flexible dielectric adhesive to a temperature less than a glass transition temperature of the molecularly flexible dielectric adhesive.

53. The method of claim 50 wherein said stacking and laminating includes providing a sheet of dielectric polymer disposed between layers of the molecularly flexible dielectric adhesive.

54. The method of claim 50 further comprising depositing molecularly flexible dielectric adhesive between the patterned elongated metal conductors on the layer of molecularly flexible dielectric adhesive.

55. The method of claim 50 further comprising providing at least two guide holes in at least the layer of molecularly flexible dielectric adhesive, and placing a pin in the guide holes for aligning at least the layer of molecularly flexible dielectric adhesive with at least one of the layers of molecularly flexible dielectric adhesive having patterned elongated metal conductors thereon and a stencil or mask.

56. A method for making an electrical connection structure comprising:
   providing a plurality of electrically conductive elongated metal wires having a length substantially greater than a diameter thereof;

coating the elongated thin metal wires with a molecularly flexible dielectric adhesive;

drying or B-staging the molecularly flexible dielectric adhesive;

bundling the coated elongated metal wires in generally parallel spatial relationship under suitable heat and pressure;

whereby the plurality of elongated metal wires are embedded in the dried or B-staged molecularly flexible dielectric adhesive; and cutting the dried or B-staged molecularly flexible dielectric adhesive and the elongated metal wires embedded therein in a direction transverse to the elongated direction of the elongated metal wires.

57. The method of claim 56 wherein the elongated metal wires include wires of at least one of copper, aluminum, brass, bronze, nickel, tin, indium, lead, zinc, silver, gold, and combinations and alloys thereof.

58. The method of claim 56 wherein said cutting includes cooling the dried or B-staged molecularly flexible dielectric adhesive to a temperature less than a glass transition temperature of the molecularly flexible dielectric adhesive.

59. The method of claim 56 further comprising applying a layer of oxidation-resistant electrically-conductive metal on ends of the elongated metal conductors exposed by said cutting.

60. A method for making an electrical connection structure comprising:

providing a sheet of electrically-conductive metal;

wire-bonding a plurality of electrically-conductive wires on one surface of the sheet of electrically-conductive metal in generally parallel spaced apart spatial relationship;

filling the spaces between the spaced apart electrically-conductive wires with a molecularly flexible dielectric adhesive;

drying or B-staging the molecularly flexible dielectric adhesive;

removing at least that part of the sheet of electrically-conductive metal to which the electrically-conductive wires are not wire-bonded;

whereby the plurality of electrically-conductive wires are embedded in the dried or B-staged molecularly flexible dielectric adhesive; and cutting the dried or B-staged molecularly flexible dielectric adhesive and the electrically-conductive wires embedded therein in a direction transverse to the elongated direction of the electrically-conductive wires.

61. The method of claim 60 wherein said removing includes one of mechanical removal and chemical etching.

62. The method of claim 60 further comprising applying a layer of oxidation-resistant electrically-conductive metal on ends of the electrically-conductive wires exposed by at least one of said cutting and said removing.

* * * * *